United States Patent
Narayanan et al.

(10) Patent No.: US 10,522,754 B2
(45) Date of Patent: Dec. 31, 2019

(54) LINER LAYER FOR DIELECTRIC BLOCK LAYER

(71) Applicant: Crossbar, Inc., Santa Clara, CA (US)

(72) Inventors: Sundar Narayanan, Cupertino, CA (US); Zhen Gu, Cupertino, CA (US); Natividad Vasquez, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 15/480,074

(22) Filed: Apr. 5, 2017

(65) Prior Publication Data
US 2017/0365780 A1  Dec. 21, 2017

Related U.S. Application Data

(60) Provisional application No. 62/350,299, filed on Jun. 15, 2016.

(51) Int. Cl.
*H01L 45/00* (2006.01)

(52) U.S. Cl.
CPC ...... *H01L 45/1233* (2013.01); *H01L 45/1253* (2013.01); *H01L 45/1608* (2013.01)

(58) Field of Classification Search
None
See application file for complete search history.

(56) References Cited

U.S. PATENT DOCUMENTS

| | | | |
|---|---|---|---|
| 7,102,150 B2 | 9/2006 | Harshfield et al. | |
| 7,129,167 B1 * | 10/2006 | Bailey, III | H01L 21/02074 438/677 |
| 7,355,324 B2 | 4/2008 | Kim et al. | |
| 7,510,929 B2 | 3/2009 | Chen | |
| 7,642,695 B2 | 1/2010 | Fujii | |
| 8,287,943 B2 | 10/2012 | Lucat et al. | |
| 8,519,485 B2 | 8/2013 | Herner | |
| 8,750,019 B2 | 6/2014 | Lu | |
| 8,815,696 B1 | 8/2014 | Herner | |

(Continued)

OTHER PUBLICATIONS

Lu et al., "Two-Terminal Resistive Switches (Memristors) for Memory and Logic Applications," 2011, IEEE, pp. 217-223, 7 pages.

(Continued)

*Primary Examiner* — Samuel A Gebremariam
*Assistant Examiner* — Jonas T Beardsley
(74) *Attorney, Agent, or Firm* — Wegman Hessler

(57) ABSTRACT

Two-terminal memory devices can be formed in part within a dielectric material that is electrically insulating and operates as a blocking layer to mitigate diffusion of metal particles employed in integrated circuit fabrication. This dielectric material can be protected from other fabrication processes corrosive to the dielectric material (e.g., CMP, HF clean, etc) by a silicon containing liner. Use of the silicon containing liner can enable a minimum thickness of the dielectric material to be preserved and can facilitate step height differences between adjacent material surfaces that form a two-terminal memory device to be on the order of less than about five angstroms. This small step height difference, particularly when underlying a switching layer of the two-terminal memory device, can yield excellent switching characteristics.

18 Claims, 13 Drawing Sheets

(56) References Cited

U.S. PATENT DOCUMENTS

| | | |
|---|---|---|
| 8,884,261 B2 | 11/2014 | Jo et al. |
| 8,946,046 B1 | 2/2015 | Jo |
| 8,993,397 B2 | 3/2015 | Herner |
| 9,036,400 B2 | 5/2015 | Lu |
| 9,425,046 B1 | 8/2016 | Gee et al. |
| 9,437,814 B1 | 9/2016 | Gee et al. |
| 9,583,701 B1 | 2/2017 | Gee et al. |
| 9,595,670 B1 | 3/2017 | Gee et al. |
| 9,627,443 B2 | 4/2017 | Jo et al. |
| 9,735,358 B2 | 8/2017 | Jo et al. |
| 9,741,765 B1 | 8/2017 | Narayanan et al. |
| 2005/0093156 A1* | 5/2005 | Naruse ............... H01L 21/76825 257/751 |
| 2006/0186759 A1 | 8/2006 | Kim et al. |
| 2007/0232015 A1 | 10/2007 | Liu |
| 2008/0001137 A1 | 1/2008 | Kozicki et al. |
| 2008/0116437 A1 | 5/2008 | Oh et al. |
| 2009/0098678 A1 | 4/2009 | Lung |
| 2009/0152737 A1 | 6/2009 | Harshfield |
| 2010/0048007 A1 | 2/2010 | Lee et al. |
| 2010/0072515 A1* | 3/2010 | Park .................. H01L 21/02494 257/190 |
| 2010/0109106 A1* | 5/2010 | Zhong .................. H01L 27/228 257/421 |
| 2010/0124818 A1 | 5/2010 | Lee et al. |
| 2010/0155687 A1 | 6/2010 | Reyes et al. |
| 2011/0001108 A1 | 1/2011 | Greene et al. |
| 2011/0059557 A1 | 3/2011 | Yamagishi et al. |
| 2011/0168966 A1 | 7/2011 | Lam et al. |
| 2011/0312151 A1 | 12/2011 | Herner |
| 2012/0015506 A1 | 1/2012 | Jo et al. |
| 2012/0193785 A1* | 8/2012 | Lin .................. H01L 21/76229 257/737 |
| 2012/0235112 A1 | 9/2012 | Huo et al. |
| 2013/0037777 A1 | 2/2013 | Mikawa et al. |
| 2013/0062586 A1 | 3/2013 | Ren |
| 2013/0082231 A1* | 4/2013 | Tada .................. G11C 13/0007 257/4 |
| 2013/0134379 A1 | 5/2013 | Lu |
| 2013/0140513 A1 | 6/2013 | Lai et al. |
| 2013/0187109 A1 | 7/2013 | Tan et al. |
| 2014/0084233 A1 | 3/2014 | Maxwell |
| 2014/0145135 A1 | 5/2014 | Gee et al. |
| 2014/0213032 A1 | 7/2014 | Kai et al. |
| 2014/0284544 A1* | 9/2014 | Miyagawa .......... H01L 45/1266 257/4 |
| 2014/0370696 A1 | 12/2014 | Tu et al. |
| 2015/0060750 A1* | 3/2015 | Sung ............... H01L 45/1253 257/4 |
| 2015/0147864 A1 | 5/2015 | Liao et al. |
| 2015/0194601 A1 | 7/2015 | Sills et al. |
| 2015/0228893 A1 | 8/2015 | Narayanan et al. |
| 2015/0340247 A1 | 11/2015 | Balakrishnan et al. |
| 2015/0340609 A1 | 11/2015 | Banno et al. |
| 2016/0020104 A1 | 1/2016 | Lin et al. |
| 2016/0190208 A1 | 6/2016 | Nazarian et al. |
| 2016/0225824 A1 | 8/2016 | Jo et al. |
| 2016/0248008 A1 | 8/2016 | Chen et al. |
| 2017/0092693 A1 | 3/2017 | Tan et al. |
| 2017/0117467 A1 | 4/2017 | Chang et al. |

OTHER PUBLICATIONS

Office Action dated Nov. 2, 2017 for U.S. Appl. No. 15/592,982, 26 pages.
Office Action dated Dec. 20, 2017 for U.S. Appl. No. 15/486,529, 17 pages.
Taiwanese Office Action and Search Report for Taiwanese Patent Application No. 106119445 dated May 31, 2018, 21 pages (including English Translation).
Notice of Allowance received for U.S. Appl. No. 15/592,982, dated Mar. 30, 2018, 24 pages.
Final Office Action received for U.S. Appl. No. 15/486,529, dated Apr. 27, 2018, 21 pages.

* cited by examiner

LINER LAYER FOR DIELECTRIC BLOCK LAYER

CROSS-REFERENCE TO RELATED APPLICATIONS

This application claims the benefit of U.S. Provisional Patent Application Ser. No. 62/350,299 filed on Jun. 15, 2016 entitled "SILICON CONTAINING MATERIAL LINER FOR DIELECTRIC BLOCK LAYER." The entirety of this application is incorporated herein by reference for all purposes.

TECHNICAL FIELD

This disclosure generally relates to a liner comprising a silicon containing material or another material that overlies a dielectric blocking layer of a two-terminal memory device to, e.g., protect the blocking layer from CMP and cleaning processes or improve surface flatness of memory device surfaces or reduce step height differences between adjacent surfaces.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for fabricating a two-terminal memory device. Fabrication can comprise the following: forming a blocking layer overlying a metal layer formed overlying a substrate. The blocking layer can comprises a dielectric material that mitigates diffusion of material of the metal layer. Forming a liner overlying the blocking layer. The liner can comprise a silicon containing material, a high-K dielectric material, or another suitable material. Forming a via in the blocking layer, and potentially in the liner, that exposes the metal layer. Forming, in the via, a conductive contact layer comprising an electrical conductive material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
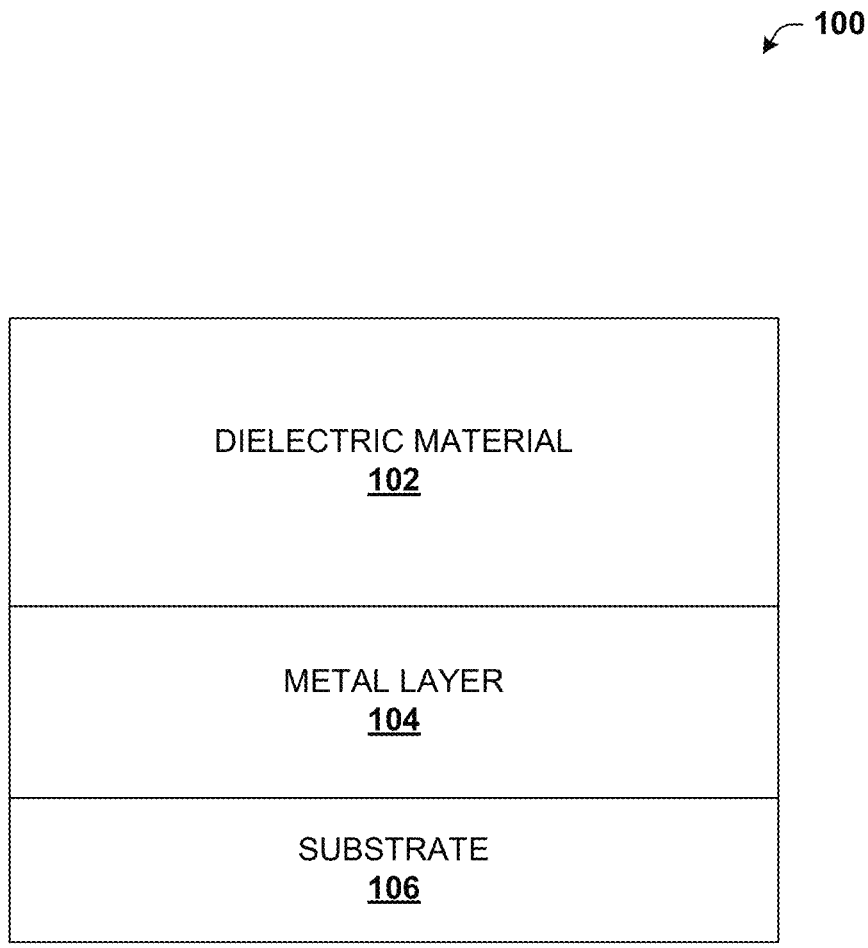
FIG. 1 illustrates a block diagram of an integrated circuit device that provides for forming a blocking layer that mitigates diffusion of material of a metal layer in accordance with certain embodiments of this disclosure.

This disclosure relates to two-terminal memory cells employed for digital or multi-level information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Embodiments of the subject disclosure can provide a filamentary-based memory cell. In some embodiments, the filamentary-based memory cell includes a non-volatile memory device, whereas other embodiments provide a volatile selector device in electrical series with the non-volatile memory device. In further embodiments, both the volatile selector device and the non-volatile memory device can be filamentary-based devices, though the subject disclosure is not limited to these embodiments.

One example of a filamentary-based device can comprise: a conductive layer (e.g., comprising, e.g., TiN, TaN, TiW, metal compounds), an optional interface layer (e.g., doped p-type (or n-type) silicon (Si) bearing layer (e.g., p-type or n-type polysilicon, p-type or n-type polycrystalline SiGe, etc.)), a resistive switching layer (RSL) and an active metal layer capable of being ionized. Under suitable conditions, the active metal layer can provide filament forming ions to the RSL. In such embodiments, a conductive filament (e.g., formed by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions)—trapped within the defect locations—becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

Generally, deformation of a conductive filament results from a change in the bias conditions to a second set of bias conditions. The second set of bias conditions suitable to cause the deformation of the conductive filament can vary for different devices. For instance, deformation of a conductive filament formed within the volatile selector device can be implemented by reducing an applied bias below a deformation magnitude (or small range of magnitudes, such as a range of about a few tenths of a volt) associated with filament formation within the volatile selector device. The deformation bias can be approximately equal to a conductive filament formation bias in some embodiments (e.g., where minimal current is provided to, or otherwise available for, the volatile selector device), whereas in other embodiments the deformation bias can be substantially lower in magnitude than the formation bias (e.g., where current through an activated volatile selector device is suitable to maintain formation of the conductive filament at below the formation bias). Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

In various embodiments of a memory cell of the present disclosure, a conductive layer may include titanium nitride (TiN), tantalum nitride (TaN), tungsten (W) or the like. The RSL (which can also be referred to in the art as a resistive switching media (RSM)) can comprise, e.g., an undoped amorphous Si layer, a semiconductor layer having intrinsic characteristics, a silicon nitride (e.g. SiN, $Si_3N_4$, SiNx, etc.), a Si sub-oxide (e.g., SiOx wherein x has a value between 0.1 and 2), a metal nitride, a Si sub-nitride, a non-stoichiometric silicon compound, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof. In various embodiments, the RSL includes a number of material voids or defects to trap or hold particles in place, in the absence of an external program stimulus causing the particles to drift within the RSL and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

The contact material layer can be comprised of any suitable conductor, such as a conductive metal, a suitably doped semiconductor, or the like. Where utilized, the contact material layer can be employed to provide good ohmic contact between the RSL and a metal wiring layer of an associated memory architecture. In some embodiments, the contact material layer can be removed and the RSL can be in physical contact with a metal wiring layer. Suitable metal wiring layers can include copper, aluminum, tungsten, platinum, gold, silver, or other suitable metals, suitable metal alloys, or combinations of the foregoing. In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal layer, in at least one embodiment. In an alternative or additional embodiment, the RSL can also be a non-stoichiometric metal oxide of different non-stoichiometric value (e.g., a different value of the parameter x, above) than that of the active metal layer. In additional embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In response to a suitable program stimulus (or set of stimuli) a conductive path or a filament of varying width and length can be formed within a relatively high resistive portion of a non-volatile memory device (e.g., the RSL). This causes a memory cell associated with the non-volatile memory device to switch from a relatively high resistive state, to one or more relatively low resistive states. In some resistive-switching devices, an erase process can be implemented to deform the conductive filament, at least in part, causing the memory cell to return to the high resistive state from the low resistive state(s), as mentioned previously. This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

According to various disclosed embodiments, disclosed resistive switching devices can be fabricated consistent with foundry compatible processes. As utilized herein, foundry compatible refers to consistency with physical constraints associated with fabrication of a semiconductor-based device in a commercial semiconductor fabrication foundry, such as Taiwan Semiconductor Manufacturing Corporation, among others. Physical constraints include a thermal budget (e.g., maximum operating temperature) of a die, and of materials and metals constructed on the die prior to a given process step. For example, where a die comprises one or more metal layers or constructs, and viability of device models require the metal layers to maintain tight position tolerance, the thermal budget may be set by the softening temperature of the metal(s) to avoid loss of metal rigidity. Other physical constraints can include, CMOS, nMOS or pMOS fabrication constraints, where suitable, fabrication toolset limitations of a particular metallization scheme (e.g., etching/masking/grooving toolsets available for Aluminum, Copper, etc.), physical properties requiring special process handling (e.g., dispersion properties of Cu, oxidation properties of metals, semi-conducting materials, etc.), or the like, or other constraints of commercial foundry. Accordingly, the phrase "foundry compatible" implies consistency with process limitations of at least one commercial semiconductor fabrication foundry.

Thermal budget refers to an amount of thermal energy transferred to a wafer during a particular temperature operation. During the process of manufacturing the resistive memory, for example, there is a desire to not adversely affect complementary metal oxide semiconductor (CMOS) devices by application of excess heat, or the like. Accordingly, CMOS devices within a substrate can impose a thermal budget constraint to the manufacture of memory components upon a CMOS chip or substrate (e.g., by way of a backend of line fabrication process). Likewise, thermal budget constraints should be considered during the manufacture of a resistive memory device in an integrated circuit, for instance.

An integrated circuit (IC) foundry includes various equipment and processes that are leveraged in order to incorporate the resistive memory into the backend of line process. The inventors of the present disclosure are familiar with backend material compatibility issues associated there with. The one or more disclosed aspects can perform the process of fabricating the resistive memory device in a relatively simple manner compared to other resistive memory fabrication processes. For example, a common material(s), or common process step(s) can be employed in fabricating differently configured memory arrays (e.g., 1T1R, 1TnR) disclosed herein.

Further, one or more disclosed aspects can enable smaller die sizes and lower costs through one or more disclosed processes for monolithic integration of resistive memory onto a product of a frontend of line process (e.g., e.g., a MOS substrate, including CMOS, nMOS, or pMOS devices). Further, the fabrication of the resistive memory devices may be performed using standard IC foundry-compatible fabrication processes. Various embodiments can also be implemented without design changes after monolithic integration (e.g., over a CMOS device) to account for changes in parasitic structure. A parasitic structure is a portion of the device (e.g., memory device) that resembles in structure a different semiconductor device, which might cause the device to enter an unintended mode of operation. Further, in at least one disclosed embodiment, there is provided a product (e.g., a memory device) of a fabrication process that can comprise monolithic integration of resistive memory over a CMOS circuitry. Further, the fabrication process can comprise IC foundry-compatible processes in a further embodiment (e.g., new or different processes are not necessary, though in alternative embodiments future improvements to such processes should not be excluded from the scope of various aspects of the present disclosure). In addition, the disclosed aspects can be performed within a thermal budget of frontend of line devices.

In some embodiments, the active metal layer can comprise a metal nitride selected from the group consisting of: $TiN_x$, $TaN_x$, $AlN_x$, $CuN_x$, $WN_x$ and $AgN_x$, where x is a positive number. In other embodiments, the active metal layer can comprise a metal oxide selected from the group consisting of: $TiO_x$, $TaO_x$, $AlO_x$, $CuO_x$, $WO_x$ and $AgO_x$. In other embodiments, the active metal layer can comprise a metal oxi-nitride selected from the group consisting of: $TiO_aN_b$, $AlO_aN_b$, $CuO_aN_b$, $WO_aN_b$ and $AgO_aN_b$, where a and b are positive numbers. In some embodiments, the switching layer can comprise a material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiNy$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers, and y is larger than x. Various combinations of the above are envisioned and contemplated within the scope of embodiments of the present invention.

In an embodiment, the active metal layer can comprise a metal nitride: $MN_x$, e.g. AgNx, TiNx, AlNx, and the switching layer can comprise a metal nitride: $MN_y$, e.g. AgNy, TiNy, AlNy, where y and x are positive numbers, and in some cases y is larger than x. In another embodiment, the active metal layer can comprise a metal oxide: $MO_x$, e.g. AgOx, TiOx, AlOx, and the switching layer can comprise a metal oxide: $MO_y$. e.g. AgOy, TiOy, AlOy, where y and x are positive numbers, and in some cases y is larger than x. In still other embodiments, the metal compound of the active metal layer is selected from a first group consisting of: $MN_x$ (e.g., $AgN_x$, $TiN_x$, $AlN_x$), and the switching layer comprises $MO_y$ (e.g. $AgO_y$, $TiO_y$, $AlO_y$) or $SiO_y$, where x and y are typically non-stoichiometric values.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, integrated circuit device 100 is depicted that illustrates forming a blocking layer that, as one example function, mitigates diffusion of material of a metal layer for integrated circuit device 100, or in conjunction with integrated circuit fabrication techniques. For instance, dielectric material 102 can be formed overlying metal layer 104 of a two-terminal memory device. Metal layer 104 can be a diffusive metal, metal alloy or metal compound in various embodiments. As an illustrative case, metal layer 104 can be, e.g., copper (Cu) or another suitable material such as aluminum (Al). In some embodiments, metal layer 104 can be a conductive layer and/or can comprise substantially any suitable conductive material. Dielectric material 102 can be a material selected to mitigate diffusion of the copper, aluminum, or other material of metal layer 104. In some embodiments, metal layer 104 can be a bitline or a wordline of an integrated circuit memory array, whereas in other embodiments, metal layer 104 can be local to integrated circuit device 100, or local to a subset of the integrated circuit memory array.

Dielectric material 102 can be referred to herein as a blocking layer and/or can represent a first portion of a blocking layer. In some embodiments, dielectric material 102 can comprise nitrogen doped carbide (NDC), SiCN, SiON, or the like. In some embodiments, dielectric material 102 is a single layer, while in other embodiments, dielectric material 102 comprises multiple layers of different materials. For example, the blocking layer can comprise dielectric material 102 as a bottom layer and a silicon containing material as a top layer.

In some embodiments, metal layer 104 can be formed on or overly substrate 106. In some embodiments, intervening layers (not shown) can be formed between metal layer 104 and substrate 106. In some embodiments, metal layer 104 and dielectric material 102 can be formed in front-end-of-line processing layers over substrate 106 and/or over one or more optional intervening layers. In some embodiments, metal layer 104 and dielectric material 102 can be formed in back-end-of-line processing layers over substrate 106 and/or one or more intervening layers. In some embodiments, metal layer 104 and dielectric material 102 can be provided as part of another suitable integrated circuit fabrication process.

Figure 2A:
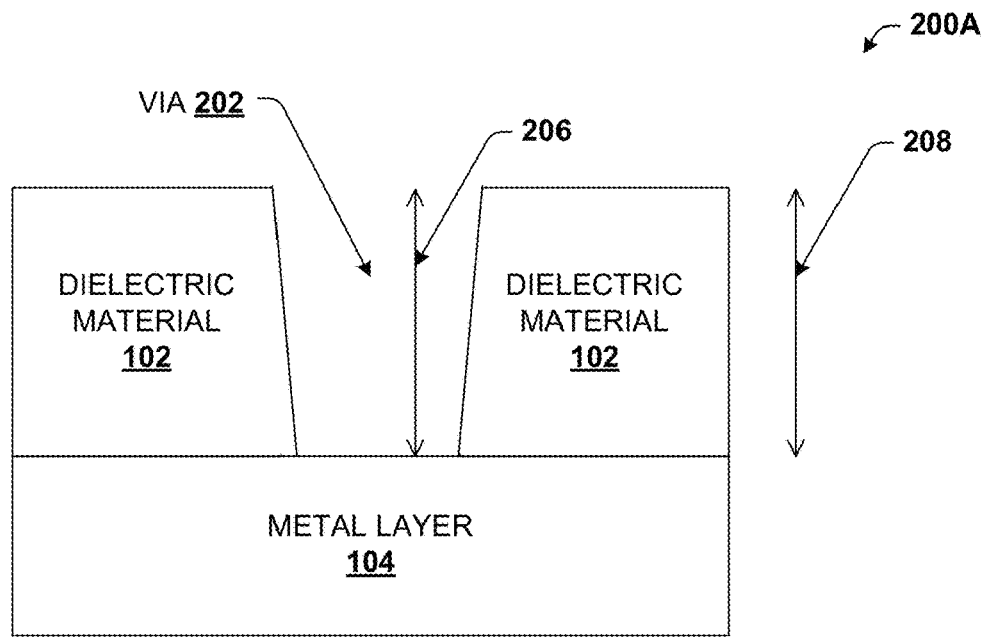
FIG. 2A illustrates an example integrated circuit device that provides for forming a via in the dielectric material in accordance with certain embodiments of this disclosure.

FIG. 2A depicts integrated circuit device 200A comprising a via 202 formed in dielectric material 102 of integrated circuit device 100. Repetitive description of like elements employed in other embodiments described herein is omitted for sake of brevity. The via 202 can be formed in response to a pattern and etching process. Formation of via 202 can expose a (top) surface of metal layer 104 of integrated circuit device 100. In some embodiments, sidewalls of dielectric material 102 that are adjacent to and exposed by via 202 can be sloped rather than vertical, as illustrated. In other embodiments, sidewalls of dielectric material 102 can be perpendicular or substantially perpendicular to the exposed surface of metal layer 104.

In some embodiments, a depth of via 202 (denoted herein as distance 206) can be equal to, substantially equal to, or directly related to a thickness of dielectric material 102 (denoted herein as distance 208). In some embodiments, a liner layer can be formed overlying dielectric material 102 prior to etching via 202 (e.g., see FIG. 3B). Distances 206 and 208 can be selected based on implementation and/or to affect certain desired characteristics that are further detailed herein. For example, in some embodiments, a thickness of dielectric material 102 (e.g., distance 208) can be in a range of between about 400-700 angstroms. In multiple layer embodiments, distance 208 can be in a range of between about 200-350 angstroms and remaining layers (not shown) on top of or below dielectric material 102 layer can be in a range of between about 200-350 angstroms, for a combined thickness in a range between about 400-700 angstroms.

Figure 2B:
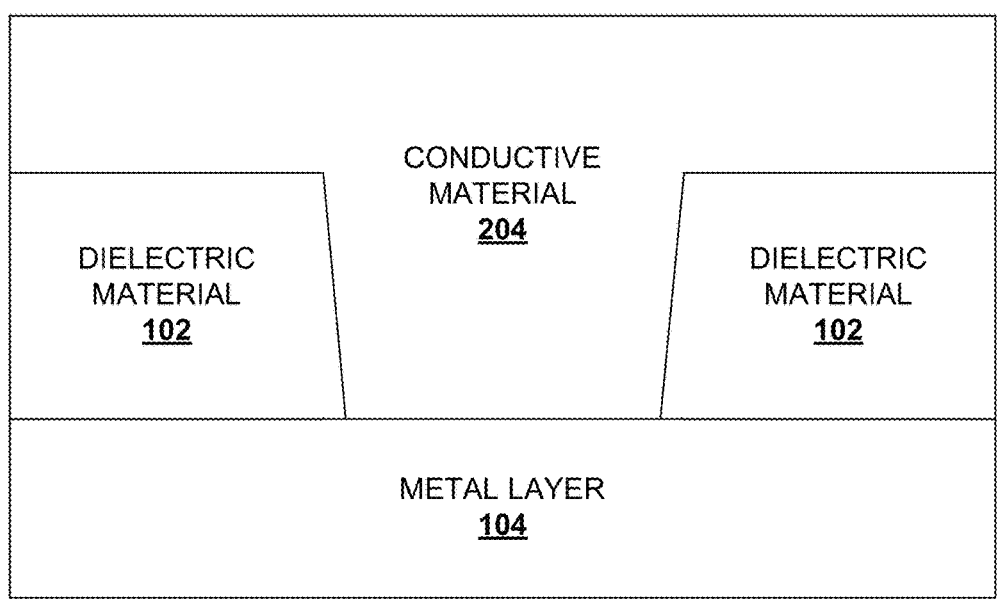
FIG. 2B illustrates an example integrated circuit device illustrating formation of a conductive material in the via that spans the dielectric material in accordance with certain embodiments of this disclosure.

FIG. 2B depicts integrated circuit device 200B comprising a conductive material in the via. Repetitive description of like elements employed in other embodiments described herein is omitted for sake of brevity. For example, conductive material 204 can be deposited or otherwise formed in via 202. Conductive material 204 can comprise an electrical conductive material. In some embodiments, conductive material 204 can form an electrode of the two-terminal memory device, such as a bottom electrode (BE).

Figure 2C:
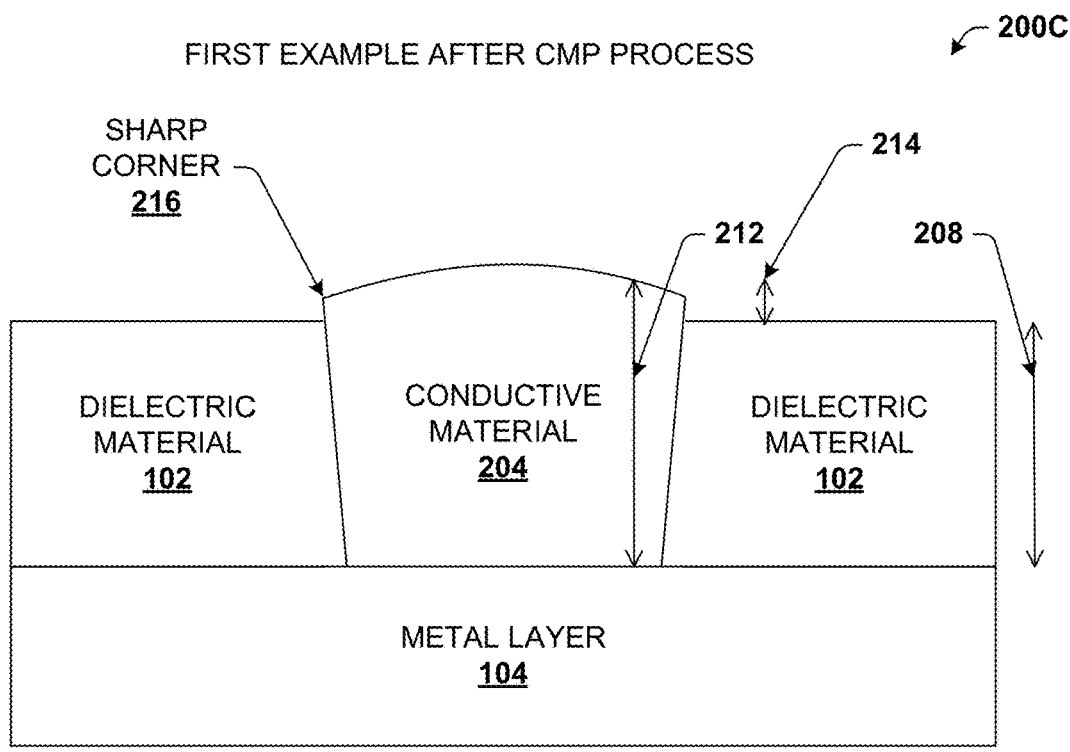
FIG. 2C illustrates an example integrated circuit device illustrating a first post-chemical-mechanical planarization (CMP) process without a liner layer in accordance with certain embodiments of this disclosure.

FIG. 2C depicts integrated circuit device 200C illustrating a first post-CMP process without a liner. Repetitive description of like elements employed in other embodiments described herein is omitted for sake of brevity. As is apparent, a thickness/height (denoted herein as distance 212) of conductive material 204 is based on the via depth (e.g., distance 206). In some embodiments, distance 212 is a combination of distance 208 and a thickness/height of a liner layer (e.g., see FIG. 3B). In some embodiments, certain benefits can be attained by reduction of distance 212. However, the thickness of dielectric material 102 (e.g., distance 208) generally should not be reduced below a threshold that is sufficient to prevent diffusion of the material of metal layer 104.

In some embodiments, conductive material 204 can be a bottom electrode to which a switching layer (not shown) is formed atop the conductive material 204 and a top electrode (not shown) formed atop the switching layer. The switching layer can be overlying and in contact with conductive material 204 (e.g., a bottom electrode) in one or more embodiments. In alternative or additional embodiments, one or more intervening layers can be provided between the switching layer and conductive material 204 (e.g., including an electrical contact layer(s), a diffusion blocking layer(s), an adhesion layer(s), a silicon containing layer(s) (e.g., to control defect density of the switching layer), or the like, or a suitable combination thereof).

However, prior to forming the switching layer, a chemical-mechanical planarization (CMP) process can be performed to, e.g., flatten conductive material 204 and a hydrogen fluoride (HF) cleaning process can be performed to, e.g., remove oxides from conductive material 204 and/or ensure a clean (metal/electrical) contact between the switching layer and conductive material 204.

In other integrated circuit devices, certain difficulties have arisen with regard to these or other CMP and HF cleaning processes. For example, the CMP process tends to be substantially erosive to the dielectric material 102. Hence, one difficulty is it can be difficult to control the amount of dielectric material 102 remaining after the CMP process (e.g., distance 208) and therefore difficult to ensure dielectric material 102 effectively operates as a blocking layer to mitigate diffusion of material of the metal layer 104. As another difficulty, a step height difference between a top surface of the dielectric material 102 and a top surface of conductive material 204 (e.g., distance 214) can be greater than a desired threshold. In some cases, distance 214 can be 40-50 angstroms or more, which can reduce the uniformity of the subsequently formed switching layer or cause other difficulties. As still another difficulty, upon formation of the switching layer, the switching layer will overlie sharp corners 216 at the top edges of the conductive material 204, which can increase distribution and/or spread associated with a filament forming voltage or cause other undesired electrical characteristics to the two-terminal memory device in operation.

In some embodiments, it can be desirable to mitigate or remove sharp corners 304. In order to mitigate the above-mentioned difficulties or to other related ends, the inventors propose forming a liner for the dielectric material 102, as detailed in connection with FIG. 3A.

Figure 3A:
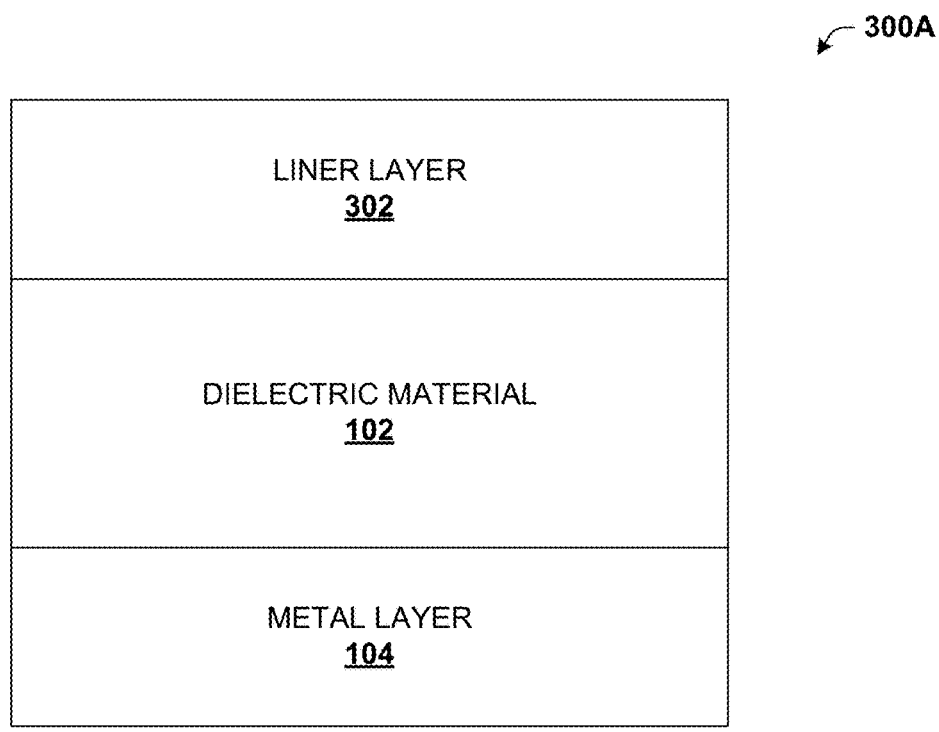
FIG. 3A depicts an example integrated circuit device that provides for formation of a liner layer for the dielectric material in accordance with certain embodiments of this disclosure.

Turning now to FIG. 3A, integrated circuit device 300A is depicted. Integrated circuit device 300 comprises a liner for the dielectric material. Repetitive description of like elements employed in other embodiments described herein is omitted for sake of brevity. The liner can be referred to herein as liner layer 302. In some embodiments, liner layer 302 can comprise a silicon containing material. For example, the silicon containing material can be formed overlying the dielectric material 102. In some embodiments, the silicon containing material can be silicon (Si). In other embodiments, the silicon containing material can be silicon nitride (SiN) or another silicon-based compound or material. In some embodiments, a thickness of the silicon containing material can be in a range of between about 100-350 angstroms.

While in some embodiments liner layer 302 can comprise a silicon containing material, additionally or alternatively, liner layer can, in some embodiments, comprise a high-K dielectric material, where K can represent a relative permittivity of the high-K dielectric material. Relative permittivity can be measured as a ratio of capacitance of a capacitor using the subject material (e.g., the high-K dielectric material) as a dielectric to the capacitance of a capacitor using a vacuum as a dielectric. In some embodiments, a high-K dielectric can be any suitable material with a K value (e.g., a value of the relative permittivity) that is equal or greater than about 7.0. Non-limiting examples of a high-K material can be, e.g., $AlO_x$, $Al_2O_3$, $HfO_2$, $HfO_x$, $HfSiO_4$, $HfSiO_x$, $HfSiON$, $Ta_2O_5$, $TaO_x$, $TiO_2$, $TiO_x$, $ZrO_2$, and/or $ZrO_x$. Other non-limiting examples of the high-K material can also include $HfZrO_4$, $ZrSiO_4$, $LaAlO_3$, $Sc_2O_3$, $Y_2O_3$, $La_2O_3$, $Lu_2O_3$, $Nb_2O_5$, $Gd_2O_3$, $BaTiO_3$, $BaSrTiO_3$, and/or $PbTiO_3$. In some embodiments, the high-K material can be either stoichiometric or non-stoichiometric depending on the implementation.

Figure 3B:
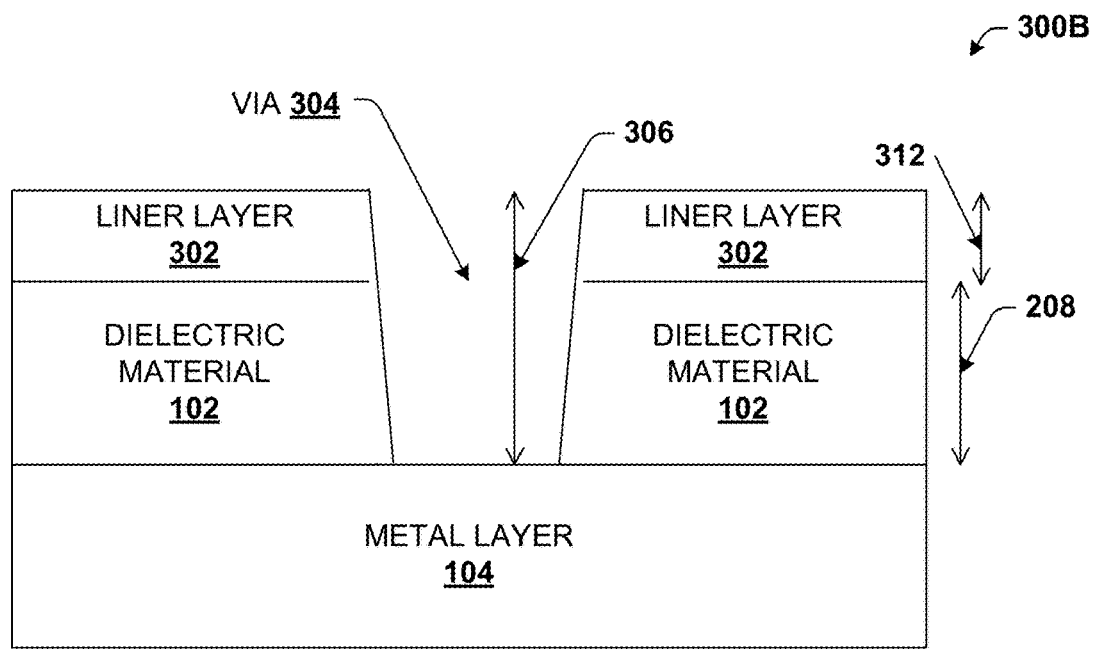
FIG. 3B depicts an example integrated circuit device illustrating formation of a conductive material in the via that spans the dielectric material and the liner layer in accordance with certain embodiments of this disclosure.

FIG. 3B depicts integrated circuit device 300B that having a via 304 formed in dielectric material 102 and liner layer 302. Repetitive description of like elements employed in other embodiments described herein is omitted for sake of brevity. The via 304 can be formed in response to a pattern and etching process. Formation of via 304 can expose a (top) surface of metal layer 104. In some embodiments, sidewalls of dielectric material 102 and liner layer 302 adjacent to via 304 can be sloped, as illustrated, rather than being vertical. In other embodiments, sidewalls of dielectric material 102 and liner layer 302 can be substantially perpendicular to the exposed surface of metal layer 104 (not shown). In some embodiments, a depth of via 304 (denoted herein as distance 306) can be substantially equal to or directly related to a thickness of dielectric material 102 (e.g., distance 208) and/or a thickness of liner layer 302 (e.g., distance 312).

Distances 306, 312, and 208 can be selected based on implementation and/or to affect certain desired characteristics that are further detailed herein. For example, in some embodiments, a thickness of dielectric material 102 (e.g., distance 208) can be in a range of between about 400-700 angstroms. In multiple layer embodiments, distance 208 can be in a range of between about 200-350 angstroms and remaining layers (not shown) on top of or below the dielectric material 102 layer can be in a range of between about 200-350 angstroms, for a combined thickness in a range between about 400-700 angstroms.

It is understood that distance 306 is a combination of distance 208 and a height/thickness of liner layer 302 (e.g., distance 312). Accordingly, in embodiments in which it is beneficial or desirable to limit distance 306 (e.g., to mitigate or manage void formation in conductive material 204), distance 312 will also be commensurately limited, e.g., as a function of an upper threshold for distance 306 and/or a lower threshold for distance 208.

Figure 3C:
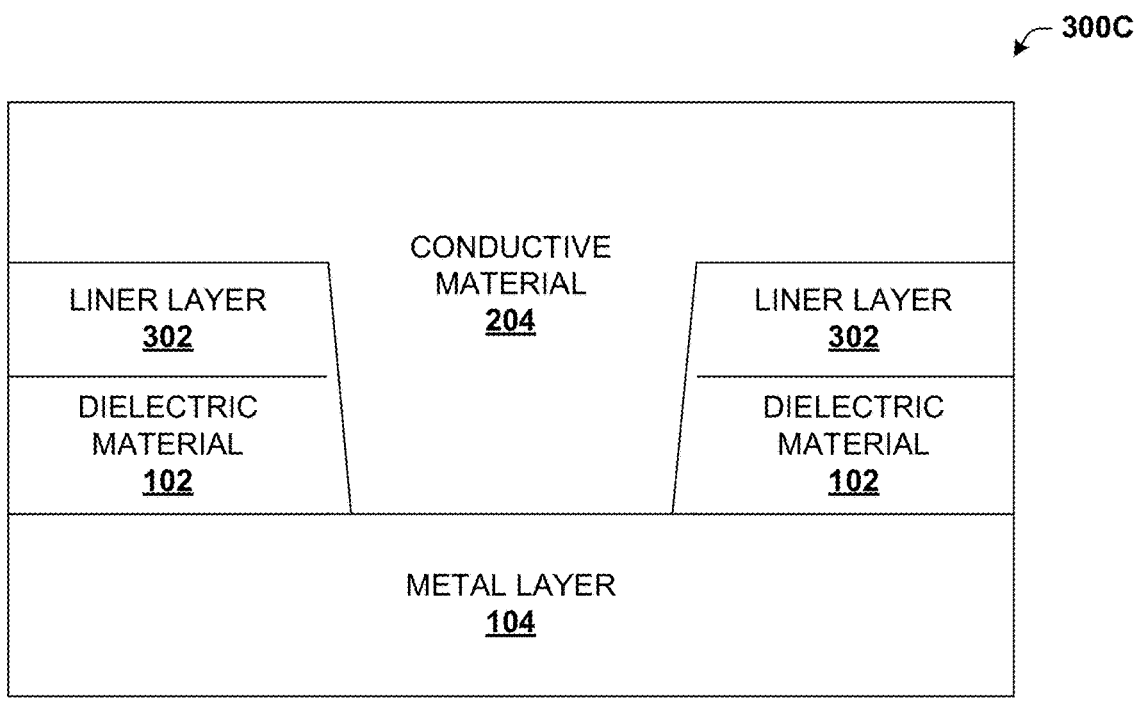
FIG. 3C depicts an example integrated circuit device embodiment in which the liner layer can be formed prior to etching the via and formation of the conductive material in the via in accordance with certain embodiments of this disclosure.

FIG. 3C depicts integrated circuit device 300C comprising a conductive material that is formed in the via that spans the dielectric material 102 and the liner layer 302. For example, conductive material 204 can be deposited or otherwise formed in via 304. Repetitive description of like elements employed in other embodiments described herein is omitted for sake of brevity. Conductive material 204 can comprise an electrical conductive material. In some embodiments, conductive material 204 can form an electrode of the two-terminal memory device, such as a bottom electrode (BE).

Figure 4:
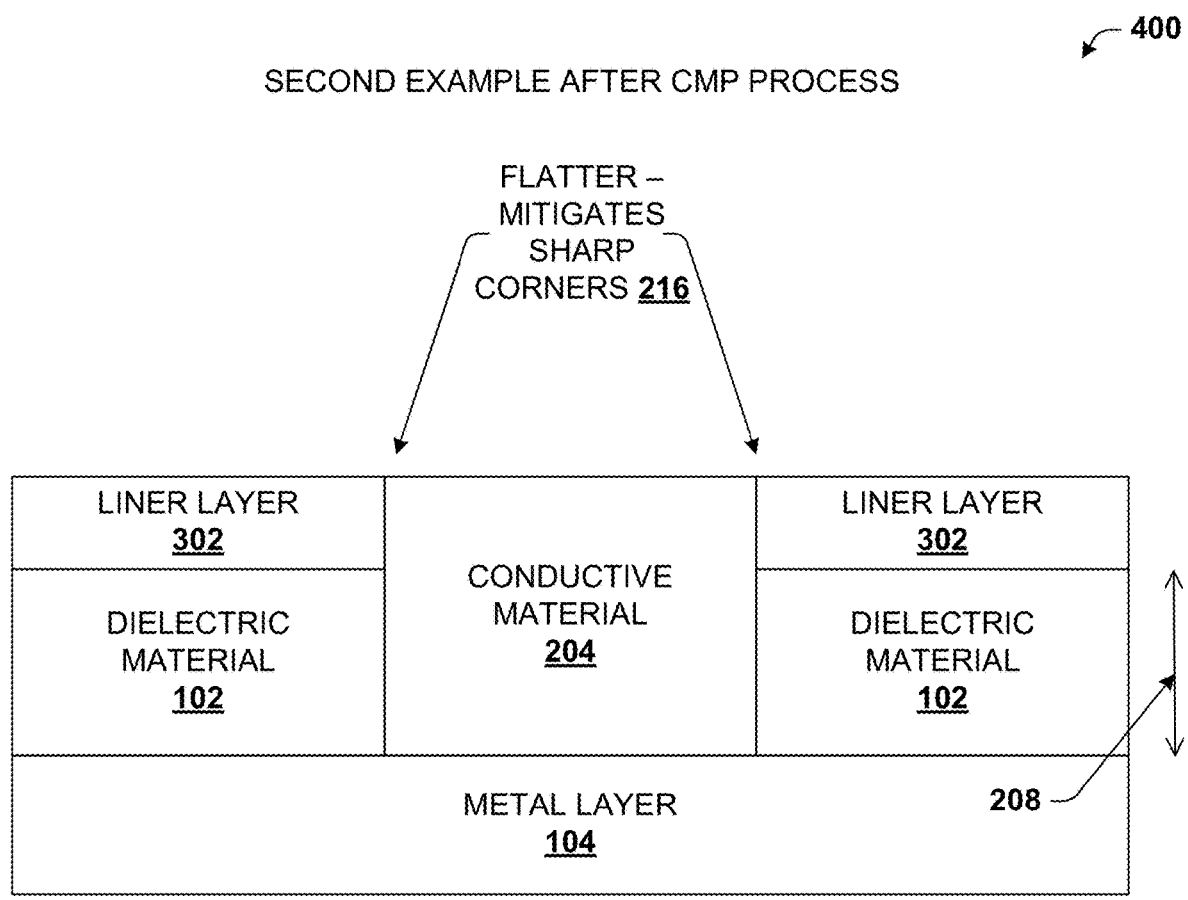
FIG. 4 depicts an example integrated circuit device illustrating a second example with the liner layer and after the chemical-mechanical planarization process is performed in accordance with certain embodiments of this disclosure.

Referring now to FIG. 4, integrated circuit device 400 is illustrated. Integrated circuit device 400 depicts an example integrated circuit device with a liner layer 302 that lines the dielectric material Example integrated circuit device 400 can represent a state after the chemical-mechanical planarization process is performed. Repetitive description of like elements employed in other embodiments described herein is omitted for sake of brevity.

The CMP process can remove a first portion of the conductive material 204 and a first portion of the liner layer 302. As illustrated, a top surface of conductive material 204 can be flatter and/or more uniform. Additionally or alternatively, sharp corners 216 can be mitigated or removed as a result of the CMP process. In some embodiments, liner layer 302 can be more resistant to the CMP process than the underlying dielectric material 102. In this regard, liner layer 302 can effectively operate as a CMP stop layer that protects dielectric material 102 from the CMP process. Thus, distance 208 can be preserved to maintain the diffusion blocking capabilities of dielectric material 102. As noted previously, liner layer 302 can comprise a silicon containing material, a high-K dielectric material, or another suitable material. In some embodiments, the composition of liner layer 302 can be selected based on an etch rate in connection with the CMP process or based on another criterion, which is further detailed herein.

Figure 5A:
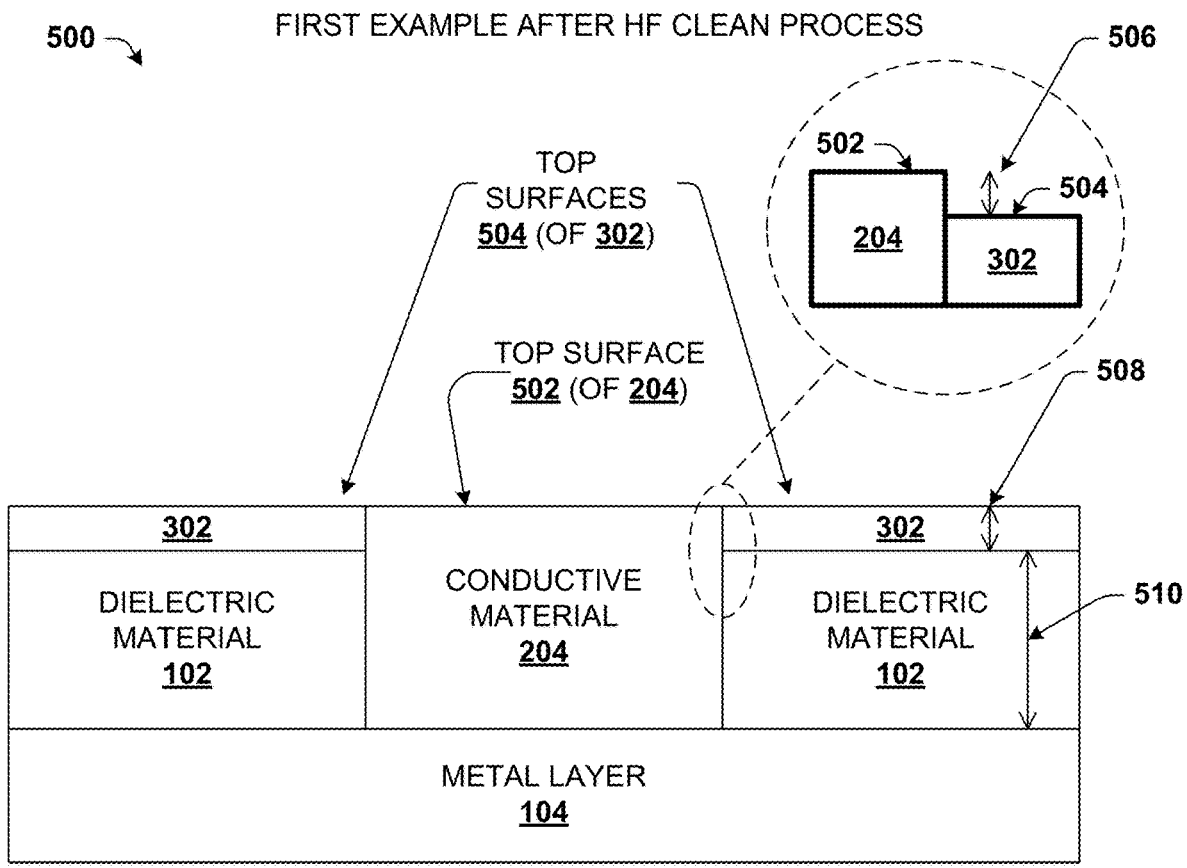
FIG. 5A illustrates an example integrated circuit device that provides for a first example after an HF clean process in accordance with certain embodiments of this disclosure.

FIG. 5A illustrates integrated circuit device 500 representing an example integrated circuit device after an HF clean process. For example, subsequent to the CMP process discussed in connection with FIG. 4, a hydrogen fluoride (HF) based cleaning process can be performed. Repetitive description of like elements employed in other embodiments described herein is omitted for sake of brevity. The HF cleaning process can remove oxides from the conductive material 204 and/or ensure that a metal or electrically conductive surface is exposed to a subsequently formed switching layer (not shown). In some embodiments, the HF cleaning process can remove a portion of conductive material 204, exposing a top surface 502. In some embodiments, the HF cleaning process can remove a portion of liner layer 302, exposing top surfaces 504. In some embodiments, a step height difference 506 between top surface 502 and one of the top surfaces 504 can be less than about five angstroms. In some embodiments, the step height difference 506 can be less than about two or three angstroms. In some embodiments, liner layer 302 can have a thickness 508 that is uniform or substantially uniform across the device. Furthermore, in some embodiments, a thickness 510 of dielectric material 102 can be preserved that is sufficient to mitigate diffusion of material of metal layer 104.

Figure 5B:
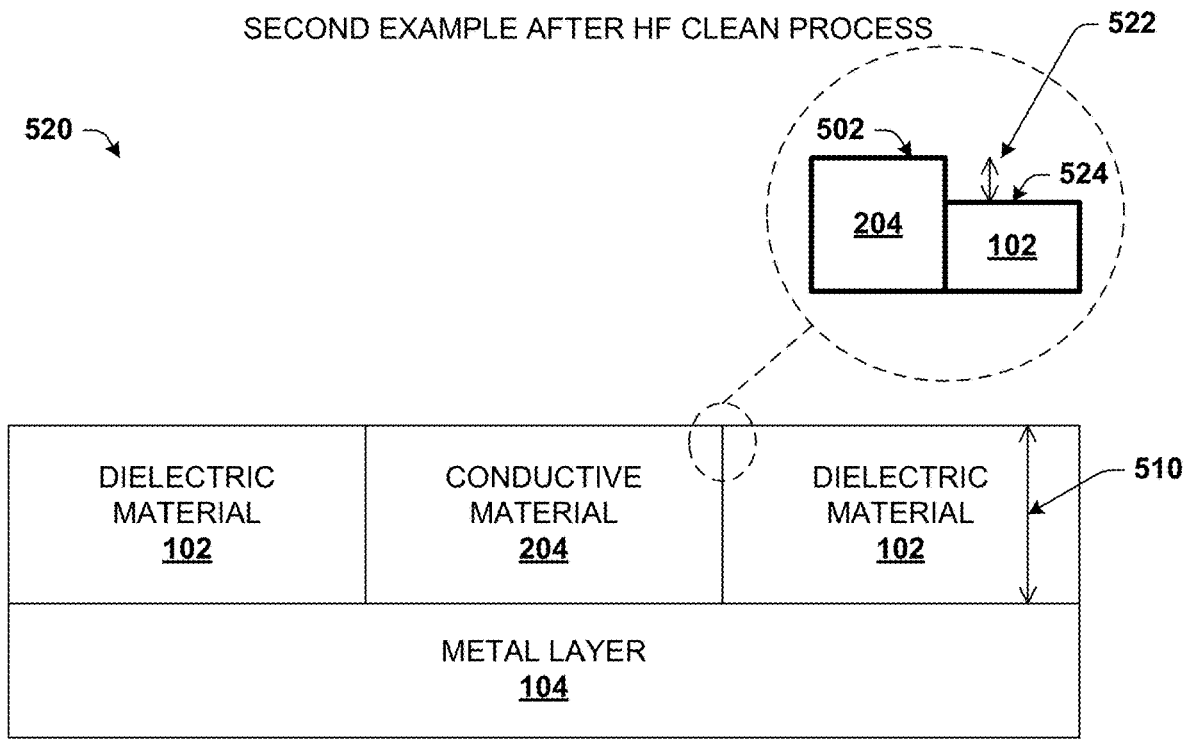
FIG. 5B depicts an example integrated circuit device that provides for a second example after an HF clean process in accordance with certain embodiments of this disclosure.

FIG. 5B illustrates integrated circuit device 510 representing a second example integrated circuit device after an HF clean process. Repetitive description of like elements employed in other embodiments described herein is omitted for sake of brevity. As noted, the HF cleaning process can remove oxides from the conductive material 204 and/or ensure that a metal or electrically conductive surface is exposed to a subsequently formed switching layer (not shown). In some embodiments, the HF cleaning process can entirely remove liner layer 302, exposing top surfaces 524 of dielectric material 102. In some embodiments, it can be desirable that liner layer 302 be present (e.g., FIG. 5A) or be completely absent (e.g., FIG. 5B). Because silicon is substantially immune to the HF cleaning process, whereas the HF cleaning process can be quite erosive to silicon nitride, system 520 can represent an embodiment in which silicon nitride is used as the liner layer 302. Hence, the HF cleaning process can effectively remove liner layer 302, but not remove dielectric material 102 once such is exposed. In some embodiments, the step height difference 522 can be less than about three to five nanometers. Furthermore, thickness 510 that is sufficient to mitigate diffusion of material of metal layer 104 can be preserved.

Figure 6:
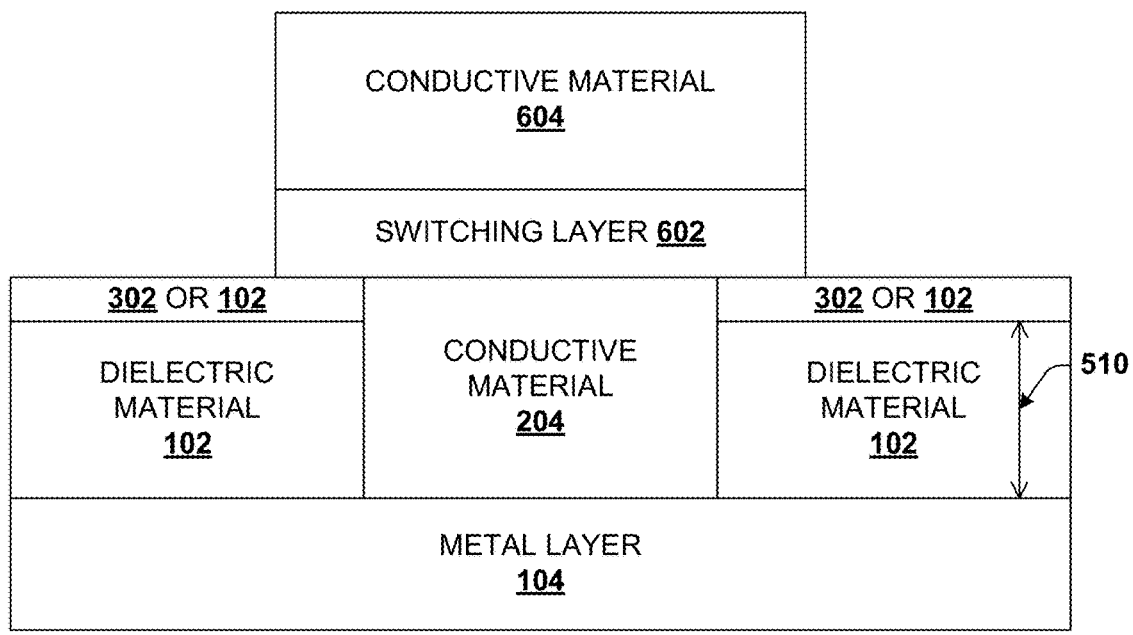
FIG. 6 depicts a first example integrated circuit device illustrating an example two-terminal memory device in accordance with certain embodiments of this disclosure.

Referring now to FIG. 6, integrated circuit device 600 is provided. Integrated circuit device 600 can represent a first example two-terminal memory device. Integrated circuit device 600 can have a metal layer 104 as detailed herein. Repetitive description of like elements employed in other embodiments described herein is omitted for sake of brevity. Conductive material 204 and dielectric material 102, can overlie the metal layer 104. The dielectric material 102 can have a thickness 510 that is sufficient to mitigate diffusion of material of metal layer 104. In some embodiments, liner layer 302 can overly the dielectric material 102. A switching layer 602 can overlie conductive material 204, dielectric material 102, and/or liner layer 302. Conductive material 604 can overlie switching layer 602.

As illustrated, the two-terminal memory device can be a pillar and collar architecture and/or design, as shown. For example, a bottom electrode (e.g., conductive material 204 can serve as a relatively narrow pillar underlying switching layer 602. Switching layer 602 can in turn serve as a relatively wider collar of the pillar and collar configuration. In some embodiments, integrated circuit device 600 can be configured as a monolithic stack (not shown), or any other suitable configuration. Regardless of the configuration, switching layer 602 can be overlying and in contact with conductive material 204 in one or more embodiments. In alternative or additional embodiments, one or more intervening layers can be provided between switching layer 602 and conductive material 204 (e.g., including an electrical contact layer(s), a diffusion blocking layer(s), an adhesion layer(s), a silicon containing layer(s) to control defect density of switching layer 304, or the like, or a suitable combination thereof).

Integrated circuit device 600 can comprise conductive material 604, which can serve as a top electrode that can be overlying and in contact with switching layer 602 in an embodiment. In alternative or additional embodiments, one or more intervening layers can be provided between conductive material 604 and switching layer 602 (e.g., electrical contact layer(s), diffusion blocking layer(s), adhesion layer(s), ion conduction layer(s), or the like, or a suitable combination thereof). Integrated circuit device 600 can comprise in some embodiments a cap layer (not shown) that can be overlying and in contact with conductive material 604 (optionally comprising one or more suitable intervening layers). In some embodiments, cap layer 308 can comprises titanium nitride (TiN). In some embodiments, conductive material 604 can comprise a same material or different material as conductive material 204.

As was noted, in some embodiments, liner layer 302 and/or dielectric material 102 can comprise a high-K dielectric material. In some embodiments, switching layer 602 can comprise at least in part a high-K dielectric material as well. In some embodiments, the high-K dielectric material included in switching layer 602 can be the same high-K dielectric material included in liner layer 302 and/or dielectric material 102. In other embodiments, the high-K dielectric material included in switching layer 602 can differ from the high-K dielectric material included in liner layer 302 and/or dielectric material 102. It is understood that in some embodiments, liner layer 302 can comprise a same material as switching layer 602, which can be a high-K dielectric. Such can facilitate compatibility between liner layer 302 and switching layer 602, which can dramatically improve long-term stability and performance of an associated two-terminal memory device.

Figure 7:
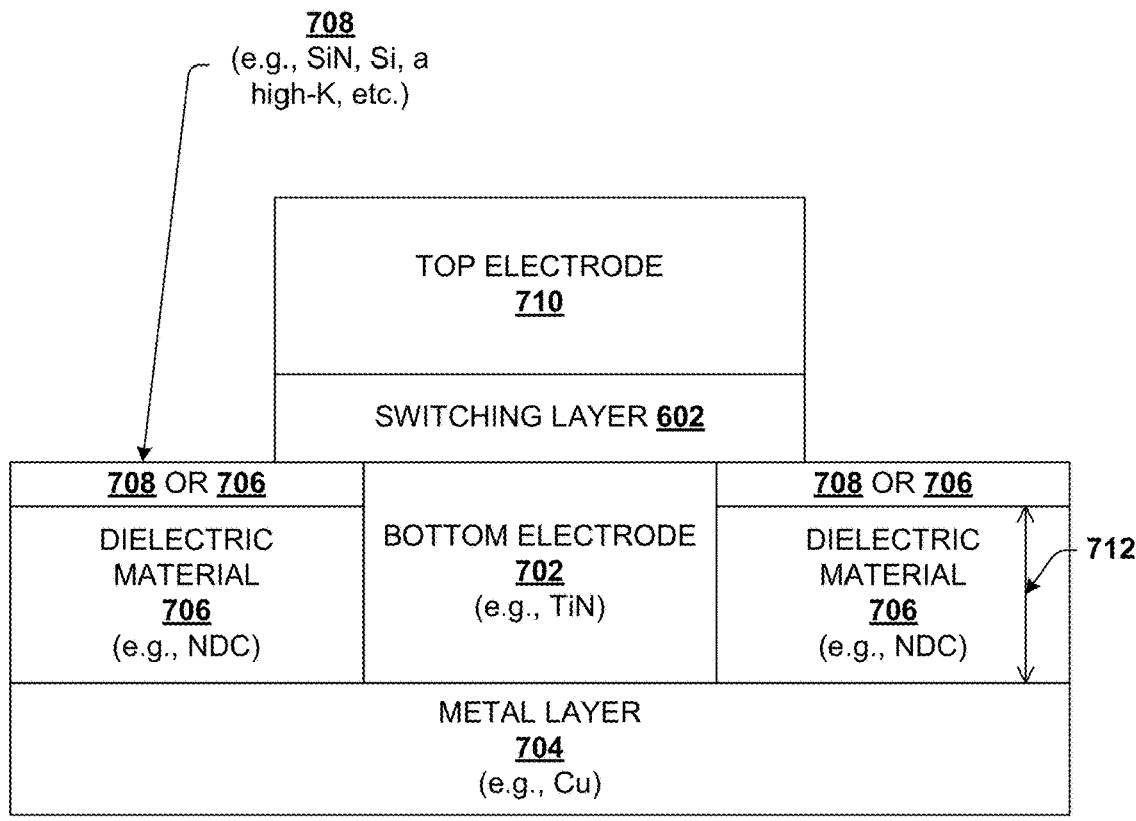
FIG. 7 illustrates a second example integrated circuit device illustrating an example two-terminal memory device in accordance with certain embodiments of this disclosure.

Referring now to FIG. 7, integrated circuit device 700 is provided. Integrated circuit device 700 can represent a second example two-terminal memory device. Repetitive description of like elements employed in other embodiments described herein is omitted for sake of brevity. Integrated circuit device 700 can have a bottom electrode 702 overlying a metal layer 704. In some embodiments, the bottom electrode 702 comprises TiN. In some embodiments, metal layer 704 comprises Cu. Adjacent to bottom electrode 702, also overlying metal layer 704 is dielectric material 706 such as, e.g., NDC. A thickness 712 of the dielectric material can be sufficient to mitigate diffusion of material of metal layer 704.

In some embodiments, liner layer 708 can overlie the dielectric material 706. liner layer 708 can be, e.g., Si or SiN, or a suitable high-K dielectric material. Switching layer 602 can overlie bottom electrode 702, dielectric material 706, and/or liner layer 708. Top electrode 710 can overlie switching layer 602. As illustrated, the two-terminal memory device can be a pillar and collar architecture and/or design.

In some embodiments, liner layer 708 and/or dielectric material 706 can comprise a high-K dielectric material. In some embodiments, switching layer 602 can comprise at least in part a high-K dielectric material as well. In some embodiments, the high-K dielectric material included in switching layer 602 can be the same high-K dielectric material included in liner layer 708 and/or dielectric material 706. In other embodiments, the high-K dielectric material included in switching layer 602 can differ from the high-K dielectric material included in liner layer 708 and/or dielectric material 706. It is understood that in some embodiments, liner layer 708 can comprise a same material as switching layer 602, which can be a high-K dielectric. Such can facilitate compatibility between liner layer 708 and switching layer 706, which can dramatically improve long-term stability and performance of an associated two-terminal memory device.

In some embodiments, switching layer 602 can comprise a metal sub-oxide such as, e.g., $AlO_x$, where x can a suitable positive number $0<x<2$. In some embodiments, switching layer 602 can comprise other materials such as those materials provided as examples of RSL detailed above. In some embodiments, top electrode 710 can comprise a metal sub-nitride such as, e.g., $AlN_x$, where x can be a suitable positive number $0<x<2$. In some embodiments, top electrode 710 can comprise other materials such as those materials provided as examples of the active metal layer detailed above. In some embodiments, bottom electrode 702 can comprise TiN, TaN, TiW or another suitable material. In some embodiments, metal layer 104 can be a diffusive metal, metal alloy or metal compound. As an illustrative case, metal layer 104 can comprise, e.g., copper or another suitable material such as aluminum.

The diagrams included herein are described with respect to interaction between several components of a memory device or an integrated circuit device, or memory architectures comprising one or more memory devices or integrated circuit devices. It should be appreciated that such diagrams can include those components, devices and architectures specified therein, some of the specified components/devices, or additional components/devices. Sub-components can also be implemented as electrically connected to other sub-components rather than included within a parent device. Additionally, it is noted that one or more disclosed processes can be combined into a single process providing aggregate functionality. For instance, a deposition process can comprise an etching process, or vice versa, to facilitate depositing and etching a component of an integrated circuit device by way of a single process. Components of the disclosed architectures can also interact with one or more other components not specifically described herein but known by those of skill in the art.

Figure 8:
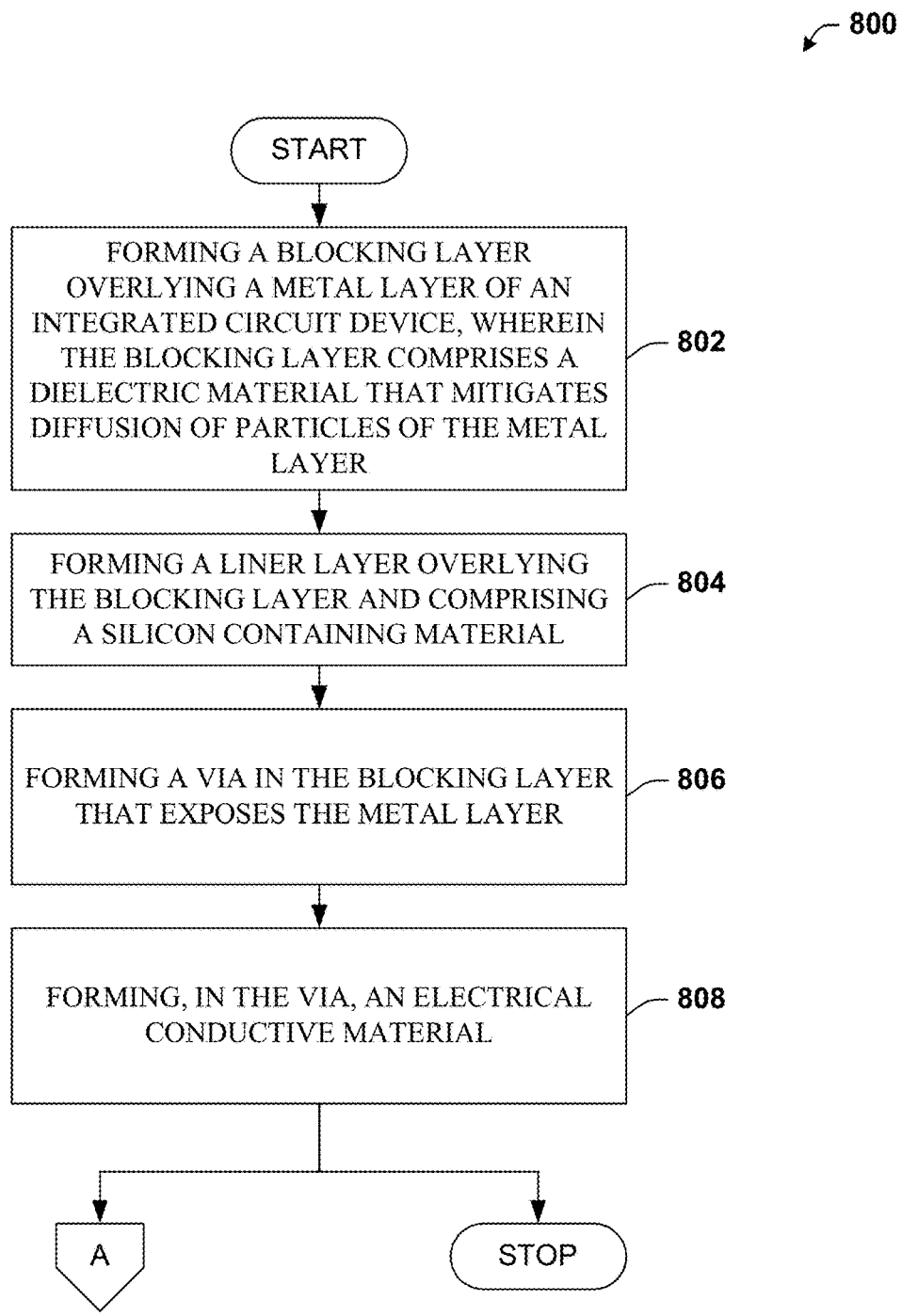
FIG. 8 illustrates an exemplary flow chart of procedures relating to fabrication of a two-terminal memory device having a liner layer comprising a silicon containing material that overlies a blocking layer in accordance with certain embodiments of this disclosure.
Figure 9:
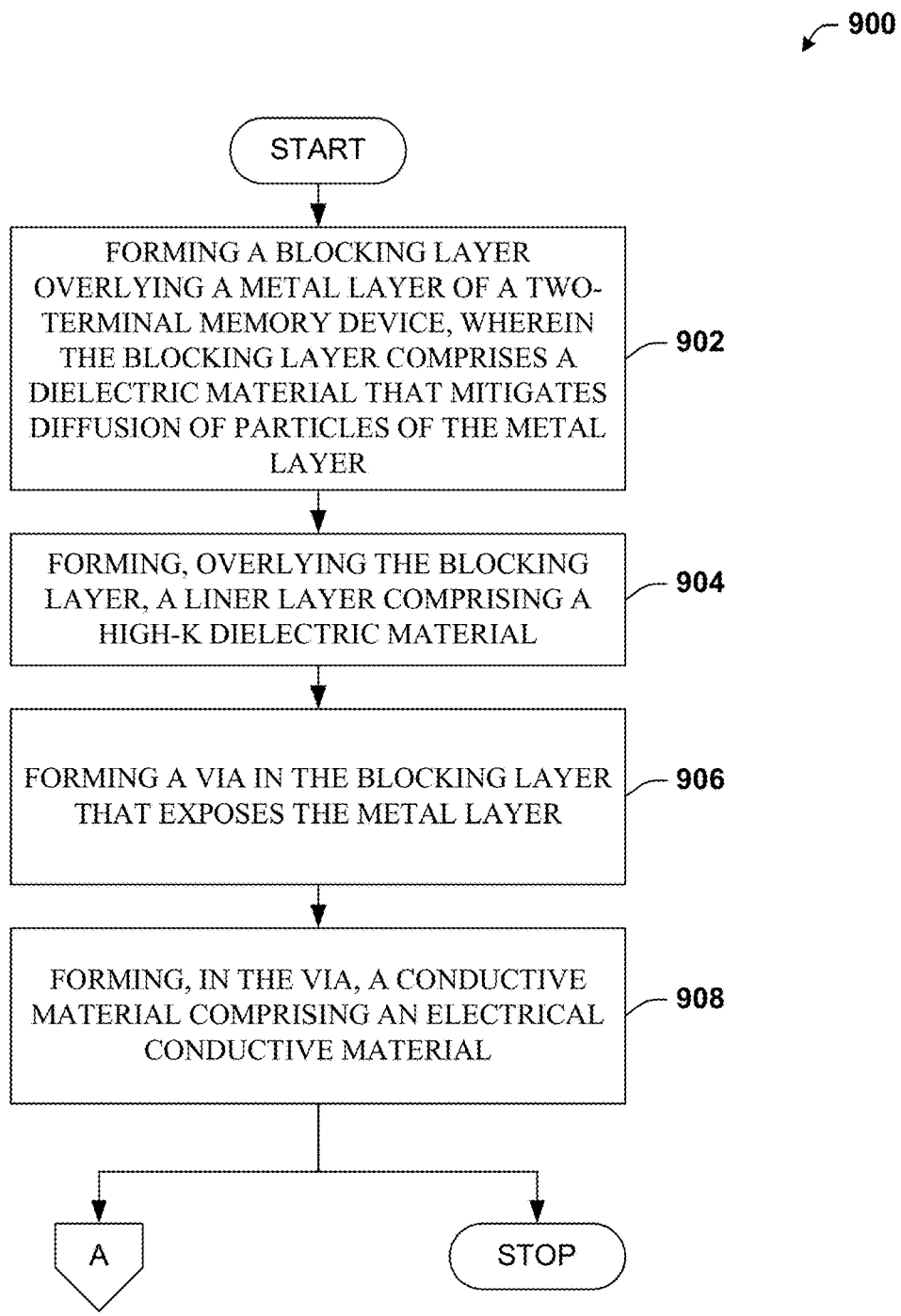
FIG. 9 illustrates an exemplary flow chart of procedures relating to fabrication of a two-terminal memory device having a liner layer comprising a high-K dielectric material that overlies a blocking layer in accordance with certain embodiments of this disclosure.
Figure 10:
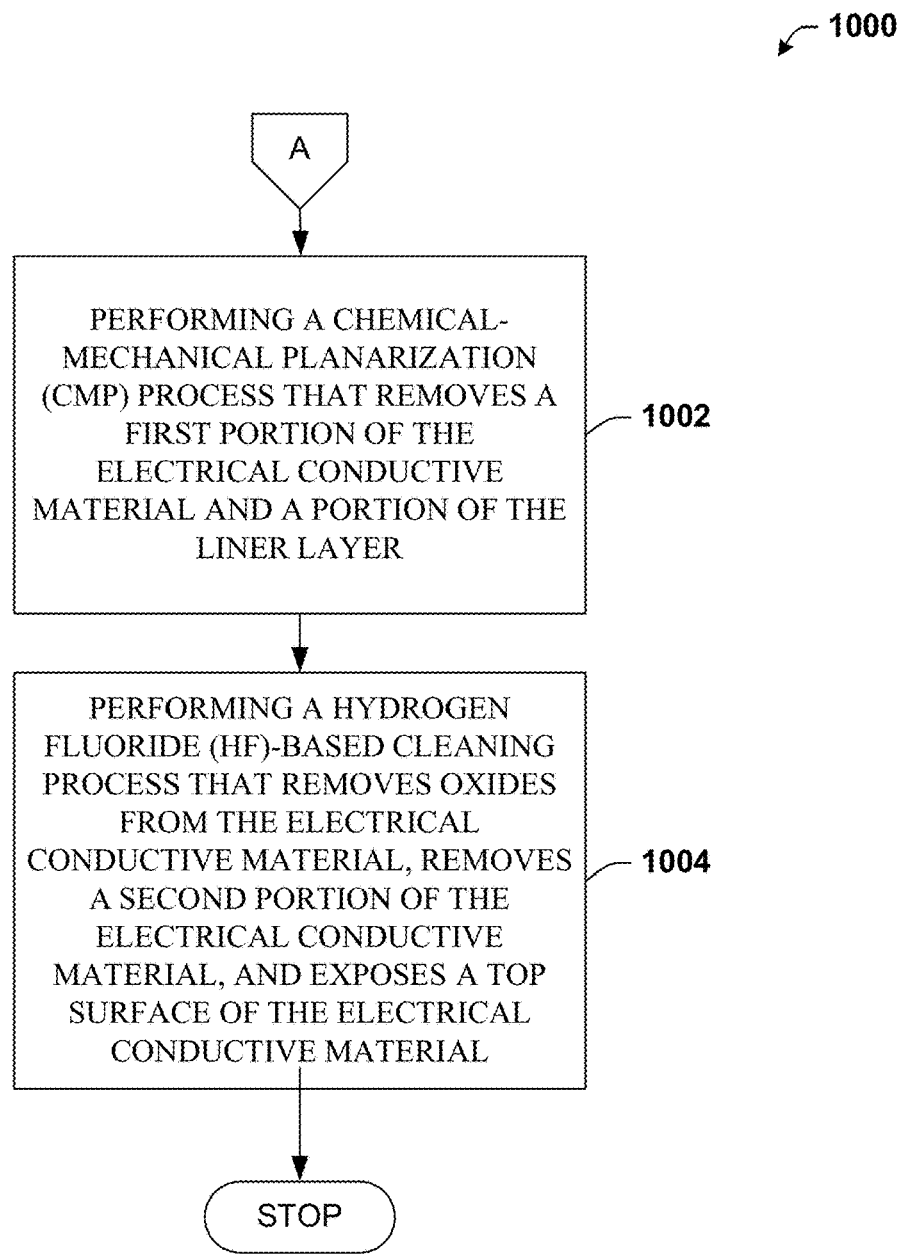
FIG. 10 illustrates an exemplary flow chart of procedures relating to additional aspects or elements in connection with fabrication of a two-terminal memory device having a liner layer that overlies a blocking layer in accordance with certain embodiments of this disclosure.

In view of the exemplary diagrams described supra, process methods that can be implemented in accordance with the disclosed subject matter will be better appreciated with reference to the flow charts of FIGS. 8-10. While for purposes of simplicity of explanation, the methods of FIGS. 8-10 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 8, exemplary method 800 is illustrated. Method 800 can relate to fabrication of a two-terminal memory device having a liner layer comprising a silicon containing material that overlies a blocking layer. For example, at reference numeral 802, a two-terminal memory fabrication device can form a blocking layer over a metal layer of an integrated circuit device and/or a two-terminal memory device. The metal layer can represent a bitline, wordline, or the like and can, in some embodiments, comprise copper or another suitable material. The blocking layer can comprise a dielectric material that mitigates diffusion of particles of the metal layer. Thus, in some embodiments, for example during subsequent fabrication processes, the blocking layer can prevent a switching layer of the two-terminal memory device from being contaminated with metal material from the metal layer. In some embodiments, the dielectric material can comprise nitrogen doped carbide (NDC).

At reference numeral 804, the fabrication device can form a liner layer overlying the blocking layer. The liner layer can comprise a silicon containing material. In some embodiments, the silicon containing material can be silicon nitride (SiN). In some embodiments, the silicon containing material can be silicon (Si).

At reference numeral 806, the fabrication device can form a via in the blocking layer that exposes the metal layer. It is understood that in some embodiments the via that exposes the metal layer can be remove material of both the blocking layer and the liner layer. At reference numeral 808, the fabrication device can form an electrical conductive material within the via. In some embodiments, the electrical conductive material can be an electrode of a two-terminal memory device, such as a bottom electrode, for example. Method 800 can end or continue to insert A, which relates to additional aspects or elements that is further detailed in connection with FIG. 10.

Referring now to FIG. 9, exemplary method 900 is illustrated. Method 900 can relate to fabrication of a two-terminal memory device having a liner layer comprising a high-K dielectric material that overlies a blocking layer. For example, at reference numeral 902, a two-terminal memory fabrication device can form a blocking layer overlying a metal layer of an integrated circuit device and/or a two-terminal memory device. The metal layer can represent a bitline, wordline, or the like and can, in some embodiments, comprise copper or another suitable material. The blocking layer can comprise a dielectric material that mitigates diffusion of particles of the metal layer. Thus, in some embodiments, for example during subsequent fabrication processes, the blocking layer can prevent a switching layer of the two-terminal memory device from being contaminated with metal material from the metal layer. In some embodiments, the dielectric material can comprise nitrogen doped carbide (NDC).

At reference numeral 904, the fabrication device can form a liner layer overlying the blocking layer. The liner layer can comprise a high-K dielectric material. In some embodiments, the high-K dielectric material has a value of K that is greater than about 7.0. It is understood that the value of K can represent a relative permittivity of the high-K dielectric material. In some embodiments, the high-K dielectric material is selected from a group consisting essentially of: $AlO_x$, $Al_2O_3$, $HfO_2$, $HfO_x$, $HfSiO_4$, $HfSiO_x$, $HfSiON$, $Ta_2O_5$, $TaO_x$, $TiO_2$, $TiO_x$, $ZrO_2$, $ZrO_x$, $HfZrO_4$, $ZrSiO_4$, $LaAlO_3$, $Sc_2O_3$, $Y_2O_3$, $La_2O_3$, $Lu_2O_3$, $Nb_2O_5$, $Gd_2O_3$, $BaTiO_3$, $BaSrTiO_3$, $PbTiO_3$.

At reference numeral 906, the fabrication device can form a via in the blocking layer that exposes the metal layer. It is understood that in some embodiments the via that exposes the metal layer can be remove material of both the blocking layer and the liner layer. At reference numeral 908, the fabrication device can form an electrical conductive material within the via. In some embodiments, the electrical conductive material can be an electrode of a two-terminal memory device, such as a bottom electrode, for example. Method 900 can end or continue to insert A, which relates to additional aspects or elements that is further detailed in connection with FIG. 10.

Turning now to FIG. 10, exemplary method 1000 is illustrated. Method 1000 can relate to additional aspects or elements in connection with fabrication of a two-terminal memory device having a liner layer that overlies a blocking layer. In some embodiments, the liner layer can comprise a silicon containing material as detailed in connection with FIG. 8. In some embodiments, the liner layer can comprise a high-K dielectric material as detailed in connection with FIG. 9.

At reference numeral 1002, the fabrication device can perform a chemical-mechanical planarization (CMP) process. The CMP process can remove a first portion of the electrical conductive material and a portion of the liner layer. It is understood that the liner layer can, in some embodiments, protect the blocking layer from the CMP process. For example, a minimum thickness of the blocking layer, for instance, a minimum thickness such that the blocking layer effectively mitigates diffusion of the metal layer, can be maintained. In some embodiments, the liner layer can be completely removed by the CMP process while in other embodiments, some of the liner layer can remain.

At reference numeral 1004, the fabrication device can perform a hydrogen fluoride (HF) based cleaning process. The HF cleaning process can remove oxides from the electrical conductive material that may have formed. The HF cleaning process can further remove a second portion of the electrical conductive material and can expose a top surface of the electrical conductive material. In some embodiments, a step height difference between the top surface and an adjacent top surface of either the liner layer (if the liner layer still remains after the HF cleaning process) or the blocking layer (if the liner layer has been completely removed) can be less than about five angstroms.

Example Operating Environments

Figure 11:
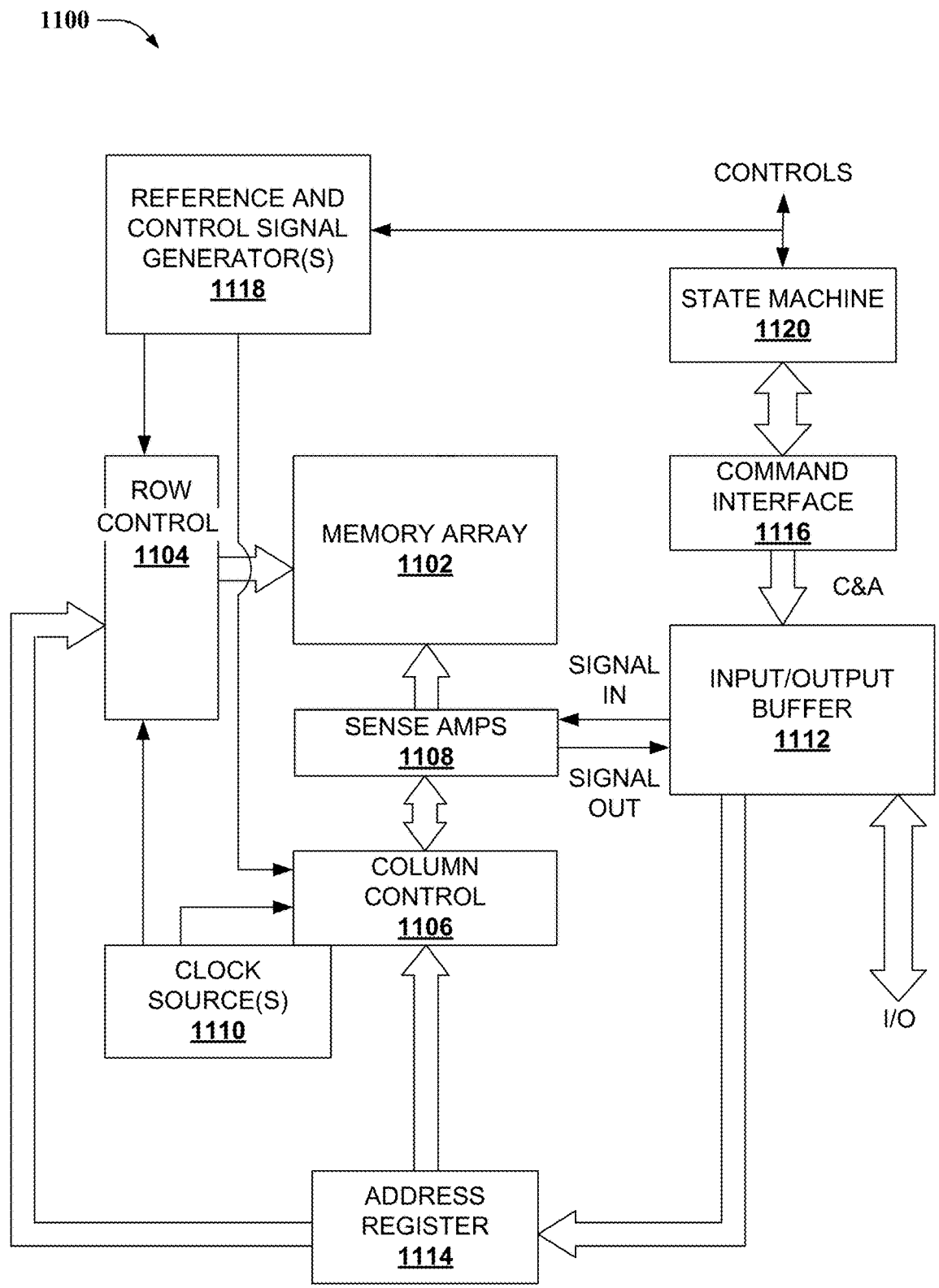
FIG. 11 illustrates a block diagram of an example electronic operating environment in accordance with certain embodiments of this disclosure.

FIG. 11 illustrates a block diagram of an example operating and control environment 1100 for a memory array 1102 of a memory cell array according to aspects of the subject disclosure. In at least one aspect of the subject disclosure, memory array 1102 can comprise memory selected from a variety of memory cell technologies. In at least one embodiment, memory array 1102 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1106 and sense amps 1108 can be formed adjacent to memory array 1102. Moreover, column controller 1106 can be configured to activate (or identify for activation) a subset of bit lines of memory array 1102. Column controller 1106 can utilize a control signal provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory array 1102. Also utilizing control signals of reference and control signal generator(s) 1118, row controller 1104 can select particular rows of memory cells with a suitable selection voltage. Moreover, row controller 1104 can facilitate program, erase or read operations by applying suitable voltages at selected word lines.

Sense amps 1108 can read data from, or write data to the activated memory cells of memory array 1102, which are selected by column control 1106 and row control 1104. Data read out from memory array 1102 can be provided to an input/output buffer 1112. Likewise, data to be written to memory array 1102 can be received from the input/output buffer 1112 and written to the activated memory cells of memory array 1102.

A clock source(s) 1108 can provide respective clock pulses to facilitate timing for read, write, and program operations of row controller 1104 and column controller 1106. Clock source(s) 1108 can further facilitate selection of word lines or bit lines in response to external or internal commands received by operating and control environment 1100. Input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1002 of FIG. 10, infra).

Input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1110. In addition, input data is transmitted to memory array 1102 via signal input lines between sense amps 1108 and input/output buffer 1112, and output data is received from memory array 1102 via signal output lines from sense amps 1108 to input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus, and determine whether data input to the input/output buffer 1612 is write data, a command, or an address. Input commands can be transferred to a state machine 1120.

State machine 1120 can be configured to manage programming and reprogramming of memory array 1102 (as well as other memory banks of a multi-bank memory array). Instructions provided to state machine 1120 are implemented according to control logic configurations, enabling state machine to manage read, write, erase, data input, data output, and other functionality associated with memory cell array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1108 or reference and control signal generator(s) 1118. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

In connection with FIG. 12, the systems, devices, and/or processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
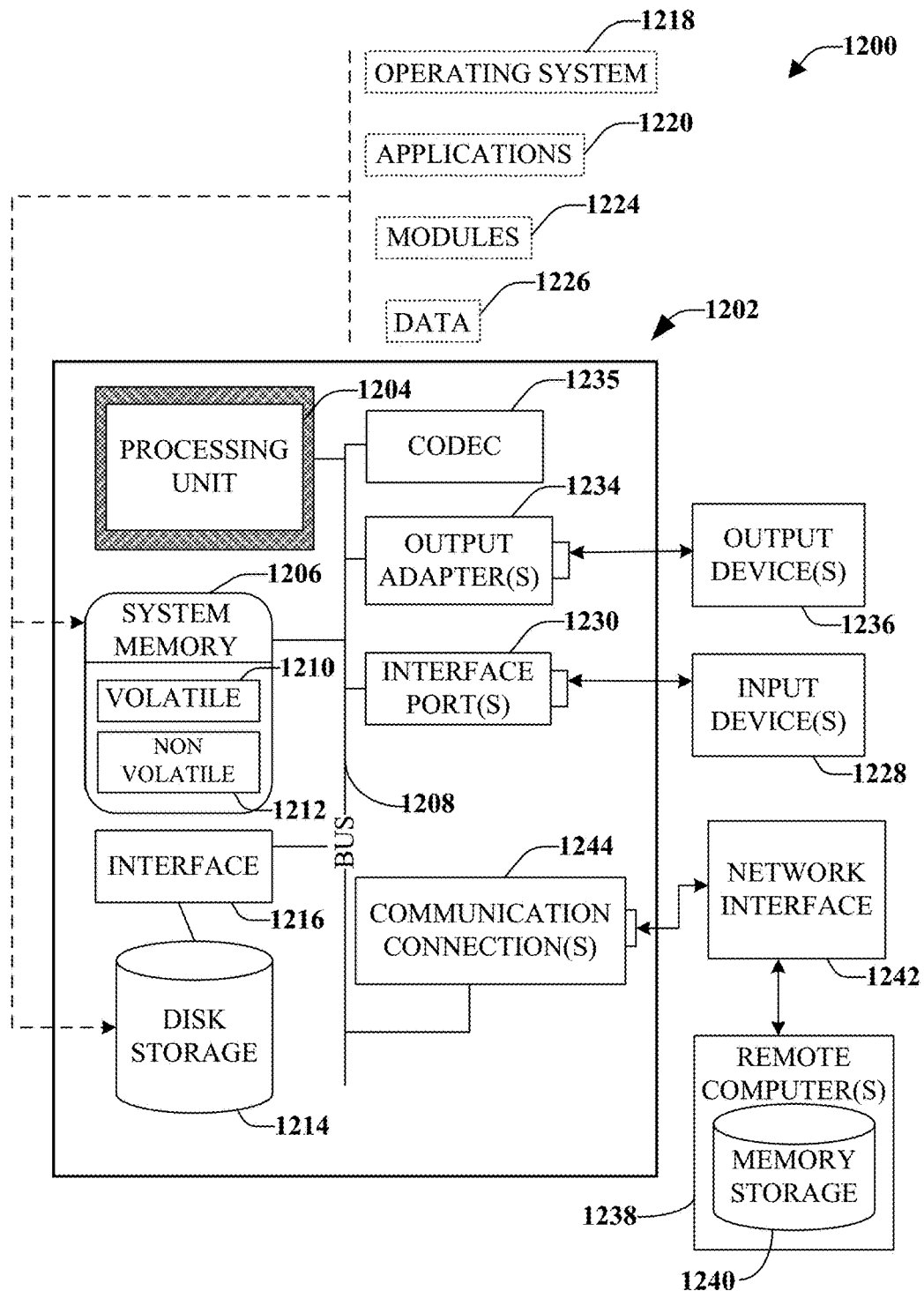
FIG. 12 illustrates a block diagram of an example computing environment in accordance with certain embodiments of this disclosure.

With reference to FIG. 12, a suitable environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or Flash memory. Non-volatile memory 1212 can employ one or more of the disclosed memory devices, in at least some embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1202 may also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 or transmitted to the server or application. The user can be provided the opportunity to opt-in or opt-out of having such information collected or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:

forming a blocking layer overlying and in direct contact with a metal layer of an integrated circuit device, wherein the blocking layer comprises a dielectric material that mitigates diffusion of particles of the metal layer;

forming a liner layer overlying the blocking layer and comprising a silicon containing material, the liner layer having a second thickness smaller than a first thickness of the blocking layer;

forming a via in the blocking layer and the liner layer that exposes the metal layer;

forming, in the via and in contact with the liner layer, an electrical conductive material as a first electrode material;

performing a first process comprising a chemical-mechanical planarization (CMP) process that removes a first portion of the electrical conductive material and a second portion of the silicon containing material; and performing a second process following the first process and comprising a hydrogen fluoride (HF)-based cleaning process that removes oxides from a surface of the electrical conductive material exposed by the CMP process, and removes a second portion of the electrical conductive material producing a cleaned top surface of the electrical conductive material, wherein the first electrode material serves as an electrode of a two-terminal memory cell.

2. The method of claim 1, wherein the dielectric material comprises nitrogen doped carbide (NDC).

3. The method of claim 1, wherein:

performing the CMP process removes electrical conductive material external to the via; and further comprising stopping the CMP process on the liner layer thereby mitigating removal of dielectric material of the blocking layer in response to the CMP process.

4. The method of claim 1, wherein the silicon containing material is silicon nitride (SiN).

5. The method of claim 1, wherein the silicon containing material is silicon (Si).

6. The method of claim 1, wherein the electrical conductive material comprises titanium nitride (TiN).

7. The method of claim 1, wherein a step height difference between the cleaned top surface of the electrical conductive material and an adjacent top surface of the blocking layer or of the liner layer is less than about five angstroms.

8. The method of claim 1, wherein a thickness of the blocking layer is sufficient to prevent diffusion of particles of the metal layer through the thickness of the blocking layer.

9. The method of claim 1, wherein a height of the via is selected to mitigate development of a void within the electrical conductive material during the forming, in the via, the electrical conductive material.

10. The method of claim 1, further comprising forming a resistive switching layer overlying and in physical contact with the electrical conductive material.

11. The method of claim 10, further comprising forming the resistive switching layer at least in part comprising the dielectric material of the blocking layer.

12. The method of claim 1, further comprising forming the blocking layer from a nitrogen doped carbide material, and selecting the silicon containing material from a group consisting of: silicon and silicon nitride.

13. The method of claim 12, further comprising selecting the electrical conductive material to be titanium nitride.

14. The method of claim 13, further comprising:

forming a resistive switching material overlying and in physical contact with the electrical conductive material; and forming a metal containing material overlying the resistive switching material, wherein the metal containing material generates metal particles that diffuse or drift within the resistive switching material forming a conductive filament therein in response to an external stimulus applied across the electrical conductive material and to the metal containing material.

15. A method, comprising:

forming a blocking layer overlying a metal layer of an integrated circuit device, wherein the blocking layer comprises a dielectric material having a first thickness that mitigates diffusion of particles of the metal layer;

forming, overlying the blocking layer, a liner layer having a second thickness smaller than the first thickness and comprising a high-K dielectric material;

forming a via in the blocking layer and in the liner layer that exposes the metal layer;

forming, in the via and contacting the liner layer, a conductive material comprising an electrical conductive material, the conductive material within the via forming a first terminal material;

performing a first surface process comprising a chemical-mechanical planarization (CMP) process and removing a first portion of the electrical conductive material and removing a portion of the liner layer, and stopping the CMP process on the liner layer; and performing a second surface process following the first surface process, the second surface process comprising a hydrogen fluoride (HF)-based cleaning process and removing oxides from the electrical conductive material, removing a second portion of the electrical conductive material, and producing a processed top surface of the electrical conductive material, wherein the first terminal material is configured to be a terminal of a two-terminal memory device.

16. The method of claim 15, wherein the high-K dielectric material has a value of K that is greater than about 7.0, and wherein K represents a relative permittivity of the high-K dielectric material.

17. The method of claim 15, wherein the high-K dielectric material is selected from a group consisting essentially of: $AlO_x$, $Al_2O_3$, $HfO_2$, $HfO_x$, $HfSiO_4$, $HfSiO_x$, $HfSiON$, $Ta_2O_5$, $TaO_x$, $TiO_2$, $TiO_x$, $ZrO_2$, $ZrO_x$, $HfZrO_4$, $ZrSiO_4$, $LaAlO_3$, $Sc_2O_3$, $Y_2O_3$, $La_2O_3$, $Lu_2O_3$, $Nb_2O_5$, $Gd_2O_3$, $BaTiO_3$, $BaSrTiO_3$, $PbTiO_3$.

18. The method of claim 15, wherein the operations further comprise forming, overlying and in physical contact with the processed top surface of the electrical conductive material, a resistive switching layer that changes state in response to an electrical stimulus, and wherein the resistive switching layer comprises at least in part the high-K dielectric material.

* * * * *